United States Patent [19]
Ben-Zvi

[11] Patent Number: 5,875,143
[45] Date of Patent: Feb. 23, 1999

[54] DYNAMIC MEMORY DEVICE WITH REFRESH CIRCUIT AND REFRESH METHOD

[75] Inventor: Jacob Ben-Zvi, Austin, Tex.

[73] Assignee: Motorola, Inc., Schaumburg, Ill.

[21] Appl. No.: 976,835

[22] Filed: Nov. 24, 1997

Related U.S. Application Data

[63] Continuation of Ser. No. 683,642, Jul. 15, 1996, abandoned.

[51] Int. Cl.$^6$ .................................................... G11C 7/00
[52] U.S. Cl. ............... 365/222; 365/185.11; 365/185.22; 365/230.03
[58] Field of Search ............................... 365/222, 230.03, 365/185.11, 185.22

[56] References Cited

U.S. PATENT DOCUMENTS 4,914,630  4/1990  Fujisthima et al. ..................... 365/222
5,247,655  9/1993  Khan et al. .............................. 395/550

FOREIGN PATENT DOCUMENTS 0488593  6/1992  European Pat. Off. .
0609577  8/1994  European Pat. Off. .

*Primary Examiner*—David Nelms
*Assistant Examiner*—Hoai V. Ho

[57] ABSTRACT

A refresh circuit (230) and a method for the refresh of dynamic memory devices (201) are described where the rows to be refreshed are determined by a logical function and by a reference address (223). The availability of refresh signals (215) for the rows at the outputs (217) of a decoder (214) is determined by control logic (224) which is connected to an address generator (212) and to a reference register (222) which contains a reference address (223). By supplying the reference address (223) to the refresh circuit (230) it is possible to determine which rows are to be refreshed. The memory array (210) of the dynamic memory device (201) can be refreshed partially and energy consumption for the refresh can be reduced.

13 Claims, 2 Drawing Sheets

FIG. 1 —PRIOR ART—

DYNAMIC MEMORY DEVICE WITH REFRESH CIRCUIT AND REFRESH METHOD

This application is a continuation of prior patent application Ser. No. 08/683,642 filed Jul. 15, 1996 now abandoned.

FIELD OF THE INVENTION

The present invention relates to a dynamic memory device, and a method to refresh dynamic memory devices, as for example but not limited to a Dynamic Random Access Memory (DRAM).

BACKGROUND OF THE INVENTION

Dynamic memory devices such as DRAM need to be refreshed. This consumes energy. In many systems energy consumption is very crucial for performance, and the power used for refreshing should be reduced.

Energy consumption can be reduced by using a memory that consists not only of a DRAM but also of a less power consuming static memory (SRAM). During standby mode critical data can be stored in the SRAM, and the DRAM can be switched off and not refreshed. Providing an SRAM leads to additional cost and space. Moreover, two different memory access cycles are required.

U.S. Pat. No. 5,331,601 describes a memory device that alters the input refresh addresses to access fewer memory cells to save power, or to address more memory cells to decrease the refresh time. The circuit contains a simple transistor configuration that blocks certain address bits, then substitutes active bits in their place to the address decoder. The circuit also includes a controller that is responsive to the memory device entering the refresh mode. When the device is used in refresh mode, the address bits may be passed unblocked to the address decoder for full user control.

Another prior art reference, European patent application 488 593, relates to the stability of the refresh in case the power supply fails.

FIG. 1 shows a schematic block diagram of prior art dynamic memory device 101.

Dynamic memory device 101 comprises memory array 110, address generator 112 and decoder 114. The combination of address generator 112 and decoder 114 is referred to as refresh circuit 130. As shown in FIG. 1, dynamic memory device 101 also comprises data terminal 120 and optional terminal 116. Memory array 110 comprises a multitude of storage elements 111 and data accessing means 118. Data accessing means 118 is provided to write, read and update data which is stored in storage elements 111. Data accessing means 118 is connected to storage elements 111 and to data terminal 120.

A physical group of storage elements 111 in memory array 110 is referred to as block 113. Blocks 113 are logically designated by $A_1, A_i \ldots A_n$. In memory array 110, the number of blocks 113 is n. Block addresses $a_1, a_i \ldots a_n$ are logically assigned to blocks $A_1, A_i \ldots A_n$. There is one block address $a_i$ for one block $A_i$.

Outputs 117 of decoder 114 are connected to storage elements 111 of corresponding blocks 113. Address generator 112 is connected to decoder 114 and generates block addresses 119 ($a_1, a_i \ldots a_n$) corresponding to blocks 113 ($A_1, A_i \ldots A_n$).

Dynamic memory device 101 can be connected to other components via data terminal 120 or optional terminal 116.

Optional terminal 116 can provide control signal 121 for address generator 112. For example, control signal 121 can be a clock signal.

In one refresh cycle, address generator 112 generates block addresses 119 ($a_1, a_i \ldots a_n$) for all blocks 113 ($A_1, A_i \ldots A_n$) of memory array 110. Block addresses $a_1, a_i \ldots a_n$ can have, for example, ascending or descending values. Block addresses $a_1, a_i \ldots a_n$ are supplied to decoder 114. Decoder 114 sends refresh signals 115 to corresponding blocks 113 on memory array 110. Upon receiving refresh signal 115 the information of all storage elements 111 of one block 113 is updated by data accessing means 118, thus each block 113 is refreshed. At the end of each refresh cycle, address generator 112 resets automatically and the cycle can start again when a clock signal is available. The clock signal can be supplied as control signal 121 via optional terminal 116. It can also be generated by address generator 112 itself.

It is frequently the case with a DRAM, that data is stored in an array comprising memory cells which are arranged for example in rows. In such a case the memory cells correspond to storage elements 111, the rows to blocks 113, a counter to address generator 112, a row decoder to decoder 114, and data accessing means 118 comprises charge detection circuits for reading the information. Row addresses are generated in the counter and supplied to the row decoder. The row decoder is connected to each row via outputs 117. The signals at the outputs of the row decoder are the above mentioned refresh signals 115. When refresh signal 115 is applied to a particular row, the information of every single memory cell of that particular row is read and the capacitor of that memory cell is recharged if required, thus that row is refreshed.

For convenience of explanation and not intended to be limiting the following example is given:

In a DRAM having an array of 1024×1024 memory cells for storing 1 Mbit data, the memory cells are arranged in 1024 rows designated as $A_1 \ldots A_{1024}$. The row decoder is connected to each row and supplies above mentioned refresh signals 115 to the rows. The counter produces increasing addresses $a_i$ which are integer numbers from $a_1=1$ to $a_{1024}=1024$. When, for example, the address $a_{256}=256$ is supplied to the input of the row decoder then all 1024 memory cells of row $A_{256}$ are refreshed one after another. The charge of each memory cell is detected by a charge detection circuit which is part of data accessing means 118. If the memory cell is charged, than it is recharged. That means that all memory cells with charged capacitors (e.g., representing the bit "1") are recharged, and these with uncharged capacitors (e.g., representing the bit "0") are not recharged.

A DRAM usually also includes data accessing means 118 to read the information of each memory cell. Additional addresses such as, for example, column addresses are required to access each memory cell. That additional addresses can be supplied via data terminal 120.

In dynamic memory device 101 of FIG. 1, all blocks 113 of memory array 110 are refreshed in every refresh cycle, thus consuming energy.

The invention provides an improved refresh circuit for dynamic memory devices and a method for refreshing such devices that reduces or overcomes the above mentioned problems of prior art.

DETAILED DESCRIPTION OF THE DRAWINGS

Figure 2:
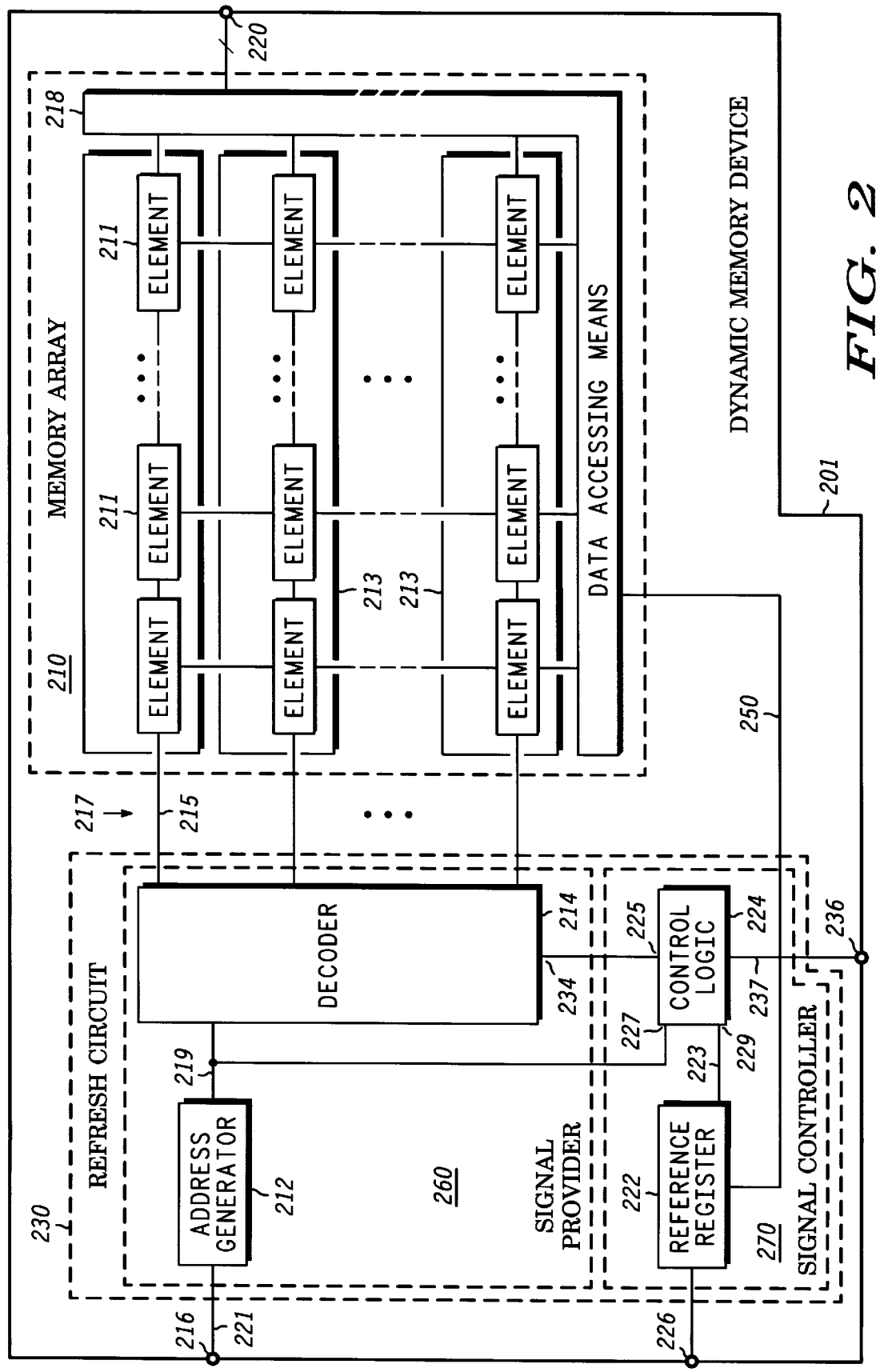
FIG. 2 shows a schematic diagram of a dynamic memory device with modified refresh circuit according to a preferred embodiment of the invention.

FIG. 2 shows a schematic diagram of dynamic memory device 201 with modified refresh circuit 230 according to a preferred embodiment of the invention.

As in the prior art, dynamic memory device 201 comprises memory array 210, address generator 212 and decoder 214. Additionally, dynamic memory device 201 comprises reference register 222 or other storage means and control logic 224. Dynamic memory device 201 also comprises data terminal 220 and optional terminals 216, 226, 236.

The combination of address generator 212 and decoder 214 is referred to as signal provider 260. The combination of reference register 222 and control logic 224 is referred to as signal controller 270. Signal provider 260 and signal controller 270 form refresh circuit 230.

As in the prior art, memory array 210 comprises a multitude of storage elements 211 and data accessing means 218. Data accessing means 218 is provided to write, read and update data which is stored in storage elements 211. Data accessing means 218 is connected to storage elements 211 and to data terminal 220. Optional terminal 216 can provide control signal 221 for address generator 212. For example, control signal 221 can be a clock signal.

A physical group of storage elements 211 in memory array 210 is referred to as block 213. Each block 213 is logically designated by $A_1, A_i \ldots A_n$. In memory array 210, the number of blocks 213 is n. Block addresses 219 $a_1, a_i \ldots a_n$ are logically assigned to blocks $A_1, A_i \ldots A_n$. There is one address $a_i$ for one block $A_i$. Outputs 217 of decoder 214 are connected to storage elements 211 of corresponding blocks 213.

Figure 1:
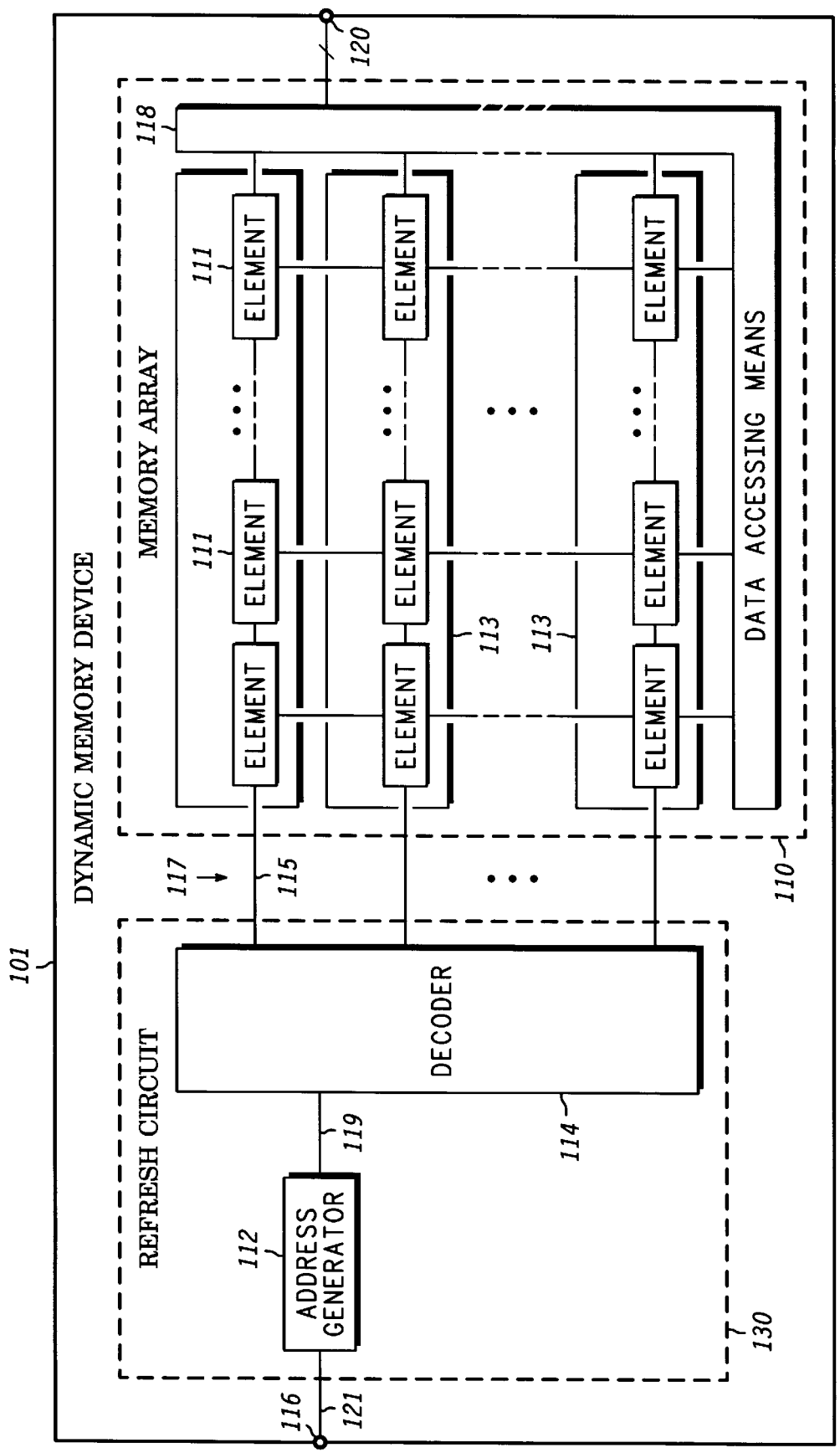
FIG. 1 shows a schematic diagram of a dynamic memory device as known in prior art.

In FIG. 1 and FIG. 2 the reference numbers 101/201, 110/210, 111/211, 112/212, 113/213, 114/214, 115/215, 116/216, 117/217, 118/218, 119/219, 120/220, 121/221, 130/230 stand for analogous components or signals. However, their operation or function is different as a consequence of the embodiment which will be explained in detail referring to FIG. 2.

Reference register 222 is used to store a reference address $a_r$. In FIG. 2, reference address $a_r$ is indicated by number 223. The reference address $a_r$ can be provided to reference register 222 by optional terminal 226. Control logic 224 is connected at input 227 to address generator 212 and at input 229 to reference register 222. Decoder 214 is equipped with ENABLE-input 234 connected to output 225 of control logic 224. Optional link 250 can be provided between memory array 210 and reference register 222. Optional terminal 236 can be provided for feeding signals to control logic 224.

Address generator 212 continually supplies block addresses 219 ($a_1, a_i \ldots a_n$) to decoder 214.

The constant reference address $a_r$ appears at input 229 of control logic 224. At input 227 of control logic 224 an address $a_i$ of the changing addresses $a_1, a_i \ldots a_n$ from address generator 212 is present. Control logic 224 compares this address $a_i$ with the reference address $a_r$ and switches decoder 214 ON and OFF according to a logical function $f(a_i, a_r)$ implemented in control logic 224. The logical function $f(a_i, a_r)$ can be expressed by terms such as greater or smaller than, odd or even, modulo, etc. In that way, decoder 214 sends refresh signals 215 to memory array 210 only when it is enabled by control logic 224 at ENABLE-input 234.

The reference address $a_r$ or information to produce it can be supplied to reference register 222 via optional terminal 226 or it can be stored internally. The logical function can be implemented in control logic 224, but any means for supplying the logical function $f(a_i, a_r)$ to control logic 224 can also be used. For example, the logical function $f(a_i, a_r)$ can be supplied to control logic 224 via optional terminal 236 or it can be supplied via optional terminal 226 or optional terminal 216 or a combination thereof, or it can be stored within dynamic memory device 201.

In the preferred embodiment for a DRAM, control logic 224 is a comparator. For example, control logic 224 enables decoder 214 for $a_i < a_r$ and for $a_i = a_r$. It disables decoder 214 for $a_i > a_r$. For example, assume there are n=1024 rows from $A_1$ to $A_{1024}$ which have addresses from $a_1=1$ to $a_{1024}=1024$, and that reference register 222 has the value of $a_r=a_{512}=512$. Address generator 212 generates addresses $a_i$ which are in this example numbers from 1 to 1024 and returns to 1. When these addresses are smaller or equal to 512 than decoder 214 is enabled and rows $A_1$ to $A_{512}$ are refreshed. Then address generator 212 counts further from 513 to 1024, but decoder 214 is disabled and rows $A_{513}, A_{514} \ldots A_{1024}$ are not refreshed. In that example, refreshed rows $A_1, A_2 \ldots A_{512}$ are contiguous. This is convenient but not essential. Rows $A_{513}, A_{514} \ldots A_{1024}$ which are not refreshed can also be contiguous.

In another example for a DRAM, control logic 224 has a different logical function $f(a_i, a_r)$. For example, when $a_r=1$, control logic 224 can enable decoder 214 for even block addresses $a_i$ and disable decoder for odd block addresses $a_i$. For $a_r=0$, control logic 224 can always enable decoder 214, independently of whether block address $a_i$ is even or odd. In that case $a_r$ can have only one bit.

In all cases, the operation of address generator 212 with the generation of all block addresses $a_1, a_i \ldots a_n$ in one cycle can be the same as in prior art. Address generator 212 and reference register 222 are independent. The number of blocks 213 in memory array 210 to be refreshed depends only on the reference address $a_r$ of reference register 222 and of the logical function $f(a_i, a_r)$ which commands control logic 224.

In comparison to the prior art, where all blocks 113 and therefore all storage elements 111 are refreshed, the present invention of FIG. 2 allows one to divide the total number of storage elements 211 into two sets: a first set of storage elements 211 to be refreshed, and a second set of storage elements 211 not to be refreshed. The term "set" is also applicable to blocks 213: storage elements 211 of the first set of blocks 213 are to be refreshed, and storage elements 211 of the second set of blocks 213 are not to be refreshed. In other words, refresh circuit 130 of prior art allows only full refresh of an array; and refresh circuit 230 of the present invention allows not only full but also partial refresh of an memory array of storage elements. It is also included in the present invention that reference address $a_r$ and logical function $f(a_i, a_r)$ can be supplied from outside dynamic memory device 201.

When a system which uses dynamic memory device 201 requires full memory capacity, reference register 222 can be set to a certain value $a_{r0}$, preferably equal to but not excluding the lowest address $a_1$ or the highest address $a_n$ of address generator 212. Then, memory array 210 can store the maximum amount of data because it will be refreshed completely on each refresh cycle. The above mentioned first set contains all blocks 213 and the second set is empty.

The present invention is not limited merely to the use of one address generator 212, reference register 222 or control logic 224. Additional units can be used and combined in order to specify blocks 213 to be refreshed more flexibly.

This is especially important if dynamic memory device 201 is a Content Addressable Memory in which the blocks to be refreshed need to be controlled by the system in which dynamic memory device 201 is used.

By optimizing refresh circuit 230 it can be guaranteed that critical data is stored even if a reference register 222 fails. Memory array 210 is refreshed completely and failure of reference register 222 only influences the power consumption and not the security of data, thus providing fail-safe operation.

The reference address $a_r$ as well as the logical function $f(a_i, a_r)$ and therefore blocks 213 to be refreshed can be determined by software and adjusted to the requirements of the system and of each application.

In a further embodiment of the invention, reference register 222 can be set to a certain value $a_{r\,fix}$. That value can not be changed from outside dynamic memory device 201. In such a configuration, control signal 237 is provided at optional terminal 236. Depending on control signal 237 memory array 210 is refreshed fully or only partially refreshed.

In a still further embodiment of the invention, reference register 222 is coupled by optional link 250 directly to data accessing means 218. The reference address $a_r$ is part of the data stored in the DRAM.

Applications for the inventions can be found for a wide range of battery powered portable systems, as for example, lap top computers, portable computer games, cellular telephones, pagers, hearing aides, etc.

The above mentioned communication and other systems often operate for a significant period of time in standby mode when only a certain amount of data needs to be stored. When activated to full operation, the system requires full memory capacity available within very short time. The present invention makes such operation possible without use of static memory.

The applications are not limited to such systems. There are many other stationary and remote systems where the power source is difficult to maintain or even impossible to replace as, for example, in solar or wind powered transmitters, remote earthquake or temperature sensors, emergency beacons, and in satellites. For example, reducing size and power consumption of an implantable medical device has an appreciable advantage for the patient, since the battery needs to be exchanged less often or not at all. With further reduction of energy consumption, dynamic memory devices can be used in applications from which they had been previously excluded.

It will be appreciated that although only one particular embodiment of the invention has been described in detail, various modifications and improvements can be made by a person skilled in the art based on the teachings herein without departing from the scope of the present invention.

The space which the hardware of the inventive refresh circuit requires is very small compared to the other elements. As the improved hardware is compatible with existing software, there is no need to modify software at the same time as introducing the present invention. Compared to the prior art solution of combining static and dynamic devices, the use of expensive hardware such as for static memory devices can be significantly reduced or avoided, thus increasing reliability and cost saving.

I claim:

1. A dynamic memory device comprising:

(a) a plurality of storage elements;

(b) a signal provider for sending refresh signals to said storage elements and for providing addresses of substantially all storage elements; and (c) a programmable signal controller coupled to said signal provider for receiving said addresses and for comparing magnitudes of said addresses to a magnitude of a reference address, said programmable signal controller for controlling said signal provider so that, during a particular refresh cycle in which addresses for substantially all storage elements are generated, only a first sub-set of storage elements with addresses in a first magnitude relation to said reference address are refreshed and a second sub-set of storage elements with addresses in a second magnitude relation to said reference address are not refreshed.

2. A dynamic memory device comprising:

(a) a plurality of storage elements;

(b) a signal provider for sending refresh signals to said storage elements; and (c) a programmable signal controller coupled to said signal provider for controlling said signal provider so that, during a particular refresh cycle, only a first sub-set of storage elements are refreshed and a second sub-set of storage elements are not refreshed, said signal provider having (i) an address generator for providing addresses for said storage elements; and (ii) a decoder for receiving said addresses from said address generator and, in response to a control signal received from said signal controller, sending refresh signals to said first sub-set of storage elements but not to said second sub-set of storage elements, said signal controller having a reference register for storing a reference address and control logic coupled to said reference register, to said address generator, and to said decoder, wherein said control logic uses said addresses generated by said address generator and said reference address to determine which storage elements are in said first sub-set and which storage elements are in said second sub-set.

3. The dynamic memory device of claim 2 wherein the reference address is supplied to said reference register by an external terminal.

4. The dynamic memory device of claim 2 wherein said control logic is controllable by a signal applied to an external terminal.

5. A method for the refresh of dynamic memory devices having a plurality of rows with storage elements, comprising the steps of:

a) storing a reference address;

b) generating an address for one of said rows;

c) relating said row address and said reference address by a logical function, thereby determining if a magnitude of said row address belongs to a first sub-set or a second sub-set of magnitudes of row addresses;

d) sending refresh signals to said row only if said row address belongs to said first sub-set; and e) repeating said steps b) to d) for substantially all rows.

6. A memory comprising:

an array of rows;

a generator which continuously generates row addresses; and a filter coupled between said generator and said array, said filter consecutively relating substantially all of said row addresses to a reference address and depending on a comparison between said reference address and said row addresses sending refresh signals to some of said rows and not sending refresh signals to the other rows.

7. A memory comprising:

an array of rows;

a generator which continuously generates row addresses; and a filter coupled between said generator and said array, said filter consecutively relating substantially all of said row addresses to a reference address and sending refresh signals to some of said rows and not sending refresh signals to the other rows said filter having
(a) a decoder receiving said row addresses and sending refresh signals, and
(b) a comparator receiving said reference address once and said row addresses consecutively, said comparator enabling said decoder or disabling said decoder.

8. An apparatus comprising:

a plurality of n blocks $A_i$ (i=1 to n), each block $A_i$ being accessible by a single address $a_i$;

a generator which in a single refresh cycle provides addresses $a_i$ from i=1 to i=n in any order;

a register for storing a reference address; and a comparator
receiving an address $a_i$;
every time said comparator has received an address $a_i$, comparing said address $a_i$ with said reference address, and
every time said comparator has compared, selectively forwarding said address $a_i$ to $A_i$ so that a refresh operation is executed in some of said n blocks, but not in all blocks $A_i$.

9. The apparatus of claim 8 wherein said reference address is constant during a single refresh cycle.

10. The apparatus of claim 8 wherein said reference address is provided from an external terminal.

11. A dynamic memory comprising:

a plurality of n rows $A_i$ (i=1 to i=n) each having storage cells;

a generator which cyclically generates addresses $a_i$ for i=1 to i=n;

a decoder receiving one address $a_i$ at a time, said decoder being either enabled or disabled, said decoder when enabled sending a refresh signal to said storage cells of row $A_i$ which is identified by said address $a_i$; and a control logic cyclically receiving addresses $a_i$, and enabling or disabling said decoder depending on a logical relation between and a reference address $a_r$.

12. A dynamic memory comprising:

a plurality of n rows $A_i$ (i=1 to i=n) each having storage cells;

a generator which cyclically generates addresses $a_i$ for i=1 to i=n;

a decoder receiving one address $a_i$ at a time, said decoder being either enabled or disabled, said decoder when enabled sending a refresh signal to said storage cells of row $A_i$ which is identified by said address $a_i$; and a control logic cyclically receiving addresses $a_i$ and enabling or disabling said decoder depending on a logical relation between $a_i$ and a reference address $a_r$, said control logic enabling the decoder for $a_i<a_r$ and $a_i=a_r$ and disabling said decoder for $a_i>a_r$ wherein r is a predetermined integer between from 0 to n.

13. The dynamic memory of claim 11 which receives said reference address from an external terminal.

* * * * *